United States Patent [19]

Wolf et al.

[11] Patent Number: 4,847,139

[45] Date of Patent: Jul. 11, 1989

[54] FLEXIBLE CIRCUITS

[75] Inventors: Gerhard D. Wolf, Dormagen; Kirkor Sirinyan, Bergisch Gladbach; Ulrich von Gizycki; Rudolf Merten, both of Leverkusen, all of Fed. Rep. of Germany

[73] Assignee: Bayer Aktiengesellschaft, Leverkusen, Fed. Rep. of Germany

[21] Appl. No.: 89,095

[22] Filed: Aug. 25, 1987

[30] Foreign Application Priority Data

Sep. 12, 1986 [DE] Fed. Rep. of Germany ....... 3631011

[51] Int. Cl.$^4$ ................................ B32B 3/00
[52] U.S. Cl. ................................ 428/209; 428/337; 428/409; 428/901; 428/30.4; 428/309.9; 427/96; 156/247; 361/398
[58] Field of Search .............. 156/247; 204/DIG. 12; 427/97, 98, 96; 428/209, 901, 458, 460, 461, 463, 419, 412, 480, 473.5, 474.4, 328, 409, 148, 308.4, 309.9, 337; 361/398

[56] References Cited

U.S. PATENT DOCUMENTS 3,854,973 12/1974 Mersereau et al. ................ 427/98
3,959,523 5/1976 Grunwald et al. ................. 427/98
4,299,863 11/1981 Tanimoto et al. ................. 427/140
4,358,479 11/1982 Canestaro et al. ................ 427/98
4,615,763 10/1986 Gelorme et al. ................... 156/643

OTHER PUBLICATIONS

Some Physical Properties of Electroless Copper, Grunwald et al, Plating, Oct. 1971, pp. 1004–1006.

Primary Examiner—Ellis P. Robinson
Assistant Examiner—P. J. Ryan
Attorney, Agent, or Firm—Sprung Horn Kramer & Woods

[57] ABSTRACT

Flexible circuits are obtained in an elegant manner, without the customary etching methods, wet-chemically in accordance with the principles of semiadditive or fully additive technology by using for the activation noble metal activators and, as base material, films or flexible boards whose surface has (a) a specific total pore volume per unit area of 0.015–0.045 dm$^3$/m$^2$, (b) an average pore diameter of 0.05–5.0 $\mu$m and (c) an average pore depth of 0.05–4.0 $\mu$m.

19 Claims, No Drawings

FLEXIBLE CIRCUITS

The invention relates to "flexible circuits", which refers to printed circuits on a flexible base material (cf. for example "Handbuch der Leiterplattentechnik" [Handbook of Circuitboard Technology]by Günther Herrmann, Lenze-Verlag, 2nd edition (1982), page 51).

The manufacture of flexible circuits, for example flat ribbon leads, circuits in electronic cameras, cable looms for connecting components, instrument panel wiring in automotive vehicles, flat leads and cable looms in data processing and in aircraft and rocket construction, from copper-laminated films by subtractive techniques is known.

The known subtractive processes not only have the disadvantage of being uneconomical but also, in the etching process, of leading to undercutting of the conducting paths. Owing to this undercutting effect it is not possible to use the subtractive processes to manufacture extremely fine conducting paths having a conducting path width and a conducting path spacing of less than 200 μm.

To avoid the abovementioned disadvantages, attempts have previously been made to develop the so-called semi-additive and fully additive processes. To implement these processes, the application of a thin, firmly adhering, electroconductive metal coat is of supreme importance.

It is known in this context that the deposition of firmly adhering metal coats to the customary rigid base materials requires elaborate pretreatment. For instance, the base boards made of glass mat reinforced epoxy resins or paper-reinforced phenolic resins must, to manufacture circuit boards, first be provided with a tackifier layer and subsequently be treated with an oxidizing liquid, preferably chromosulfuric acid, before the boards thus pretreated are activated with ionic or colloidal nobel metal solutions, masked and metallized in commercially available metallizing baths.

In addition to these methods requiring many stages, this technique has the disadvantage that entrained chromium ions irreversibly poison the baths and that the circuit boards obtained have unsatisfactory electrical properties.

It has therefore already been proposed to activate the nonconductive surfaces of substrates, for example base carriers of circuit boards, without oxidative pretreatment with a solution or a lacquer based on a noble metal amine complex formation or on palladium chloride for the subsequent chemical metallization (cf. for example DE-A-No. 1,696,603 and DE-A-No. 2,116,389, corresponding to U.S.-A-No. 3,560,257 and U.S.-A-No. 4,248,632 respectively).

Yet, although these activation processes have a gentle effect on the material, they have hitherto failed to become established in practice since they require relatively large amounts of noble metal and their metal coats do not attain the high standards of abrasion resistance demanded in the electronics industry. For that reason, at least the former patent publication recommends an additional surface treatment with etchant (cf. column 6, line 48).

It has now been found that these disadvantages can be avoided and high-quality flexible circuits are obtained in a simple manner, i.e. without etching, by means of a semiadditive or fully additive technique using customary activator systems when the surface of the base material used is characterized by (a) an area-specific total pore volume of 0.015–0.045 $dm^3/m^2$
(b) an average pore diameter of 0.05–12.0 μm and
(c) an average pore depth of 0.05–12.0 μm.

The preferred pore volume is between 0.020 and 0.040 $dm^3/m^2$, in particular between 0.023 and 0.038 $dm^3/m^2$.

Preferred pore diameters are 0.5–5 μm, in particular 1–2 μm.

Preferred pore depths are 0.1–4.0 μm, in particuar 0.5–2.5 μm.

The process according to the invention for producing flexible circuits is characterized in that a base material having the surface constitution specified above is treated with an organometallic activator system of the specified type, and optionally sensitized with a reducing agent, the semifinished goods thus obtained are metallized in a wet-chemical metallizing bath over the whole area or in part, and subsequently the circuit boards are completed in accordance with the known principles of the semiadditive or fully additive technique.

In a particular embodiment of the process according to the invention, process reliability is increased by heat-treating the film substrates thus treated at a temperature from 50° C. to the decomposition range, preferably in the region of the softening point.

To produce the surface constitution according to the invention, it is possible to use not only physical methods (for example specific sand-blasting techniques, brushing methods or laser irradiation) but also chemical processes (for example treatment with selective solvents). Another variant for producing these surfaces consists in freeing metal-laminated bases from their lamination by chemical means in a redox bath (see for example G. Herrmann et al. "Leiterplatten, Herstellung und Verarbeitung" [Circuit Boards, Manufacture and Processing], pages 103 to 108, G. Leuze Verlag, Saulgau/Württ. 1978) or electrogalvanically, whereupon the surface structure according to the invention becomes established automatically.

The base materials which can be used are films or flexible boards made of various polymers, for example polytetrafluoroethylene (Teflon), polyvinylidene fluoride and polyvinyl fluoride (Tedlar) or aromatic and/or aliphatic polyesters, polyimides, polyamide imides, polycarbonates, polyamides, polysulphones such as Udel, a polycondensate based on bisphenol A and 4,4'-dichlorodiphenyl sulphone, polyether sulphones which are preparable for example by polycondensation of the sulphonyl chloride of diphenyl ether, polyhydantoins, polybenzoxazinediones, polyphenylene sulphide and polyphenylene oxides such as poly-2,6-dimethylphenylene oxide. It is of course also possible to use graft polymers, copolymers and mixed polymers of the abovementioned materials for carrying out the process according to the invention. In principle it is possible to use any film material which is suitable in the specific application areas of the electronics industry. Polymers which are distinguished by their soldering bath stability have hitherto proved particularly useful. In this connection, attention may be drawn to aromatic polyimide, polyamide imide, polyester and Teflon films.

The thickness of the films to be used is immaterial to the essence of the invention and can range from about 20 μm to 250 μm. In the extreme it is even possible to use substrates which are thinner or thicker than the stated range.

It is of course also possible to combine various film materials with one another in various ways. For example polyimide films can contain a Teflon layer on one or both sides. The only precondition is that this applied layer is bonded sufficiently firmly to the carrier film and that it is capable of accepting the necessary roughness, however applied.

The film materials can be reinforced with reinforcing materials, such as glass, mineral, carbon and aramid fibres or mats and mixtures thereof. Similarly, mineral fillers can have been incorporated in the films for various reasons.

Particularly preferred base material consists of aromatic polyesters (for example polyethylene terephthalate and polybutylene terephthalate) and of polyimides as described for example in DE-A-1,202,981 (corresponding to U.S. Part. No. 3,287,311) and preferably having the following formula:

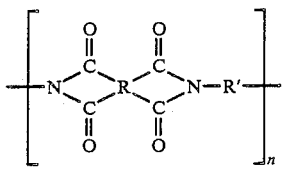

in which
R = tetravalent aromatic radical, for example

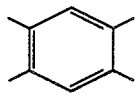

and
R' = arylene radical, for example

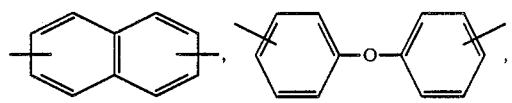

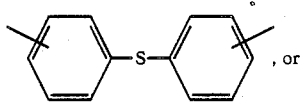

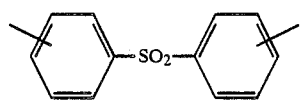

To produce the characteristic surface on the base materials in accordance with preferred processes, the flexible carriers are laminated on one or both sides with metal foils which are subsequently detached.

To detach the metal lamination, not only acid but also neutral and alkaline redox baths are suitable. Examples are redox systems based on $H_2O_2$, $ClO_3^-$ and $Fe^{3+}$ and containing hydrochloric or sulphuric acid and ammoniacal redox systems containing sodium chloride and ammonium persulphate. It is also possible to use other redox systems which bring about an etching away of the metal layer for carrying out the process according to the invention, provided that the plastic surface is not attacked by the redox bath used. For that reason, the customary aggressive plastic pickling baths based on chromosulphuric acid should ideally be avoided, in particular since they also impair the physical properties of the base material.

Optimal surface structures are obtained on starting from a board material which has been laminated with metal films produced by electroplating.

This is because such metal foils have a particular porosity which, on laminating onto the polymeric base material, is crucially responsible for producing the specific surface constitution of the base materials.

The formation of roughness on the film surface can be enhanced by adding to the electroplating baths complex compounds based on antimony, cadmium, iron, selenium and tellurium or subsequently roughening the electrolyte film by chemical or mechanical means.

The production of such metal (preferably copper) foil characterized by a porous surface structure (topography) has frequently been described in the literature. In this connection there may be mentioned: "Metalloberfläche" volume 31 (12), 563 (1977), volume 38 (10), 439 et seq. (1984) and volume 38 (3), 103 et seq. (1984) and the following patent literature: DE-A-No. 2,235,522, DE-A-No. 2,249,796, DE-A-No. 2,500,160, DE-B-No. 1,496,748, U.S. Pat. No. 3,220,897, U.S. Pat. No. 3,328,275, US 3,580,010 and US 3,227,636. By processes of the last U.S. patent specification mentioned, it is possible to obtain porous metal (copper) foils whose porous side has a particularly active metal/metal oxide structure.

Suitable metal foils are in principle derivable from all the customary electroplatable metals, such as Co, Ni, Pt, Pd, Ag, Al and in particular Au and especially Cu and mixtures thereof (cf. for example "Plating", 52, 228–232 (1965)).

After the metal lamination has been etched away the polymeric carrier material is left with a surface structure which, in its dimensions, corresponds to that of the base material to be used according to the invention.

To produce the surfaces according to the invention by sandblasting, the pulverulent material should have an average particle size of 0.1–10 μm, preferably 5–7 μm. Powder materials based on quartz, corundum and diamond are highly suitable for carrying out the process. To avoid any chemical degradation of the polymeric base material, the sandblasting can of course also be carried out under an inert gas atmosphere.

Preferably, the porous surface structure suitable for carrying out the process according to the invention can be produced by the known membrane production methods (cf. for example DE-A-No. 2,431,071, U.S. Pat. No. 4,286,015, DE-A-No. 3,205,289 and GB No. 2,030,843). Herein, as is known, the polymeric base material is wetted with a solution of prepolymer or polymer which, in respect of its chemical nature, is identical with the base material and in solvent mixtures of variable volatility, which optionally also contains swelling agents and pore-forming agents. The highly volatile solvent is evaporated in part, and subsequently the coagulating or precipitating agent is drawn out of the polymer matrix, for example under vacuum.

The "area-specific total pore volume" is the product of the specific total pore volume (cm$^3$/g) and the weight per unit area (g/m$^2$) of the base materials, i.e.

$$[cm^3/g]\cdot[g/m^2]=[cm^3/,^2] \text{ or } [10^{-3}\cdot dm^3/m^2]$$

The definition of the specific total pore volume of solid surfaces is found in Angew. Chem. 84, p. 331-336 (1972).

"Average pore depth" and "average pore diameter" are to be understood as meaning averages (on the basis of the Gaussian standard distribution) of the pore dimensions, determined by means of a scanning electron microscope.

Suitable activators can be not only of the organic but also of the inorganic type. The organic activators to be used according to the invention are noble metal compounds known per se, for example Pd- and Pt-complexes of dienes, polymeric complexing agents and $\alpha,\beta$-unsaturated ketones, as described for example in DE-A-No. 3,025,307, -3,150,985 and -3,324,767.

Preference is given to organometallic compounds, preferably $\Omega$-complex compounds, which in addition to the group required for bonding the metal contain at least one further functional group. Such compounds are known and described in DE-A-3,148,280.

The further functional group is responsible for a very firm adhesion to the substrate surface, it being possible for this adhesion to be based on a chemical reaction with the substrate surface or on adsorption.

Particularly suitable for a chemical attachment of the activator to the substrate surface are functional groups such as carboxylic acid groups, carbonyl halide groups, carboxylic anhydride groups, carboxylic ester groups, carboxamide and carboximide groups, aldehyde and ketone groups, ether groups, sulphonamide groups, sulphonic acid groups and sulphonate groups, sulphonyl halide groups, sulphonic acid ester groups, halogen-containing heterocyclic radicals, such as chlorothiazinyl, chloropyrazinyl, chloropyrimidinyl or chloroquinoxalinyl groups, activated double bonds, as in the case of vinylsulphonic acid or acrylic acid derivatives, amino groups, hydroxyl groups, isocyanate groups, olefin groups and acetylene groups, as well as mercapto groups.

In a further embodiment, use is made of those noble metal complex compounds in which the ligands and the ions or molecules to be complexed are engaged in a "guest/host" interaction.

Suitable selective complex ligands are cyclic or acyclic compounds which, owing to their chemical and/or physical nature, are a host molecule or in the presence of ionic or neutral compounds to be complexed take on the form required for complex or adduct formation, the polar regions, in the presence of the medium to be complexed, being oriented theretowards.

The literature describes numerous selective host molecules which can form a selective guest-host complex with alkali metal or alkaline earth metal cations such as Li$^+$, Na$^+$, K$^+$, Ca$^{2+}$ or NH$_4^+$ [cf. E. Weber, "Kontakte" (Darmstadt) 1, (1981) and J.G. Schindler, "Bioelektrochemische Membranelektroden" [Bioelectrochemical Membrane Electrodes] pages 77-104, Walter de Gruyter Verlag, Berlin/New York (1983)] or with heavy metal ions such as Co$^{2+}$, Ni$^{2+}$, Fe$^{3+}$, Cd$^{2+}$ and Ag$^+$ and also with anions such as Cl$^-$ and SO$_4^{2-}$ [cf. J.G. Schindler loc. cit., pages 104-112] and also with neutral ligands or compounds.

Suitable for carrying out the activation are all host complex ligands which contain hetero atoms (O, N and S) in their chain. Highly suitable are crown ethers, cryptands and podands and derivatives thereof and also cyclic peptides, furthermore tetrahydrofuran-containing, ester-linked macrolides and analogous compounds based on hetero atoms such as S and N, which are known for example in biological systems as transport regulators.

A definition of the terms "crown ether", "cryptands" and "podands" can be found in the surveys by F. Vögtle, "Kontakte" (Darmstadt) (1977) and (1978), E. Weber, "Kontakte" (Darmstadt) (1984) and Vögtle "Chemikerzeitung" 97, 600-610 (1973).

Particular preference is given to substituted and unsubstituted host ligands based on cyclic or acyclic crown ethers which can additionally contain hetero atoms such as N and S in their ring system. Such compounds are described in DE-A-2,842,862 and EP-A-10,615.

In another variant for carrying out the activation process, the host molecules mentioned are covalently incorporated in polymeric or oligomeric compounds and then complexed with the desired activating media. Such oligomeric or polymeric systems are known and are described for example in "Novel Polyurethanes with Macroheterocyclic (Crown Ether) Structures in the Polymer Backbone", J.E. Herweh, J. of Polymer Science: Polymer Chemistry Edition, vol. 21, 3101 (1983).

The inorganic portion of the host/guest molecules is preferably formed from compounds of the formulae H$_2$PdCl$_4$, Na$_2$(PdCl$_2$Br$_2$), Na$_2$PdCl$_4$, Ca PdCl$_4$, Na$_4$(PtCl$_6$), AgNO$_3$, HAuCl$_4$, CuCl$_2$ and CuCl. Pd compounds are preferred.

Inorganic activators are in particular colloidal systems of metallic Pd, Pt, Au and Ag, which can optionally in addition contain hydrolysable compounds of elements of main and secondary groups 3 and 4 of the periodic table (for example Si, Ti, Ta, Zn, Sn, Zr and Al).

Such activating systems are in some instances obtainable in the trade and have otherwise been frequently described in the literature (cf. for example "Kunststoffgalvanisierung" [Electroplating of Plastics], by R. Weines, Eugen Lenz Verlag, Saulgau/Württemburg (1979), pages 180-209).

Preference is given to Pd and Pd/Sn systems.

The activators can be used in concentration ranges of 0.001 g/l (relative to the noble metal) down to the particular solubility limit. Preference is given to working with 0.1 to 3.0 g/l of these substances.

Owing to their high storage stability (no clouding of the solutions, in some instances after weeks of storage) and their high sorption in the ultraviolet and/or visible spectrum, they are highly suitable for continuous concentration monitoring using a photometer.

In addition, the sorption properties of the complex compounds to be used according to the invention can be increased further by introducing specific substituents (in particular —NO$_2$, —NR$_3$, —SO$_3$H and —CN).

To increase the peel-off resistance of the activator or metal layer, the said host molecules can additionally be provided with a further functional group.

Particularly suitable for a chemical attachment of the activator to the substrate surface are functional groups such as carboxylic acid groups, carbonyl halide groups, carboxylic anhydride groups, carboxylic ester groups, carboxamide and carboximide groups, aldehyde and ketone groups, ether groups, sulphonamide groups, sulphonic acid groups and sulphonate groups, sulphonyl halide groups, sulphonic acid ester groups, halogen-containing heterocyclic radicals, such as chlorotriazinyl, chloropyrazinyl, chloropyrimidinyl or chloroquinoxalinyl groups, activated double bonds, as in the case of vinylsulphonic acid or acrylic acid derivatives, amino groups, hydroxyl groups, isocyanate groups, olefine groups and acetylene groups, as well as mercapto or alkenyl radicals from $C_8$, in particular oleic, linoleic, stearic or palmitic groups.

If no attachment through a chemical reaction takes place, adhesion can also be caused by adsorption of the organometallic activators on the substrate surface, causes for the sorption being for example hydrogen bonds or van der Waals forces.

It is expedient to adapt the functional groups which cause the adsorption to the particular substrate. For instance, long-chain alkyl or alkenyl groups in the activator molecule improve the adhesion to substrates made of polyethylene or polypropylene. On the other hand, to metallize polyamide- or polyester-based articles, activators having for example additional carbonyl or sulphone groups are particularly advantageous.

Particularly suitable for an attachment of the activator to the substrate surface by adsorption are functional groups such as carboxylic acid groups and carboxylic anhydride groups.

In practice, the activation is in general carried out by wetting the base support to be metallized with a solution of the selective metal complex in a suitable organic solvent, removing the solvent and, optionally, sensitizing with a suitable reducing agent. Thereafter the support thus pretreated can be metallized in a customary metallizing bath.

Suitable reducing agents for the sensitization are aminoboranes, alkali metal hypophosphites, alkylboron hydrides, hydrazine hydrate and formalin. The wetting of the substrates can be effected by spraying, printing, saturating or impregnating.

To increase the adhesion of the metal layer to the support surface, particular preference is given to using those solvents or solvent mixtures which lead to a small degree of dissolving or swelling of the plastic surface to be metallized.

Particularly highly suitable for carrying out this process are aprotic solvents such as 1,1,1-trichloroethane, methylene chloride, trichloromethane, perchloroethylene and toluene. Activating systems according to the invention which additionally contain hydrolysable organometallic compounds of titanium, of aluminium or zirconium, or silicon or of tantalum in amounts of 0.1–20, preferably 0.1–3, particularly preferably 0.1–2, g/l are preferably used.

The removal of the solvents from the wetted supports is effected simply by evaporating or, in the case of relatively high-boiling compounds, by extraction.

In a preferred process variant, the organic activating baths are monitored using a photometer as detector.

In a particularly preferred embodiment of the activation, the reduction in the metallizing bath is carried out from the start with the same reducing agent as used in the currentless metallization.

This embodiment is particularly suitable for aminoborane-containing nickel baths or formalin-containing copper baths.

Suitable metallizing baths for use in the process according to the invention are commercially customary hot and cold baths or nickel salts, cobalt salts, copper salts, gold and silver salts or mixtures thereof, the Cu baths being very particularly preferable.

Suitable metals for any electroplating to be carried out are: Ni, Co, Cu, Ag, Al, Cr and Au. Preference is given to Cu, Au and Ni, very particular preference to Cu.

To increase, if desired, the adhesion of the metal layer deposited onto the plastic surface according to the invention and to ensure 100% process reliability, a heat treatment can be carried out.

The heat-treatment temperature can be varied within the wide range from 50° C. to the particular decomposition range of the polymeric base material, preferred temperatures of polyamide films being for example 125° C.–250° C., in particular 140°–180° C. Suitable temperatures for polyester films are for example 125–180° C., in particular 140–170° C. The heat-treatment times can be varied between 5 minutes and 10 hours, preference being given to the times 10 to 60 minutes. To avoid any degradation of the base material, the heat treatment can be carried out under inert gas.

It is of course also possible to carry out the heat treatment after electroplating or chemically enhancing the metal layer to the desired layer thickness.

The precursors obtainable from these films by activating and the flexible circuits produced therefrom surprisingly have the following good properties:

1. They are stable in air to moisture and weathering and heat effects.
2. Their activator layer is not removable from the surface during the application and the development of photoresist layers. They can be easily detected by means of known surface analysis methods, such as ESCA.
3. The peel-off resistance of the metal layers as defined in DIN 53,494 is at least 15, preferably however, 30–35 N/25 mm or more.
4. In the course of the sensitization or metallization, no poisoning occurs of the metallizing or sensitizing baths.

The process is particularly highly suitable for manufacturing flexible circuits having extremely fine conducting paths.

By means of this process it is also possible to produce thin (<10 μm) and particularly thin metal coats (0.3 to 5 μm) on films which, given suitable structuring, can find utility in various application areas.

These thin coats, depending on the desired thickness, can be prepared by chemical metal deposition or by chemical metal deposition and electroplating.

The process according to the invention is advantageous for producing:

Sheet keyboards, contact mats, sensors, digitizers, multilayers, screens and the like. Flexible circuits manufactured in this way can also be used for producing 3-dimensional circuits by injection into the back in injection moulding machines.

EXAMPLE 1

A polyimide film which is coated with copper on one side and commercially available, for example from the firm of Krempel, Stuttgart (West Germany), is freed from the Cu layer by etching off in an alkaline 15.7% strength sodium chloride solution (pH ~ 12), washed with $H_2O$ and then with methanol and dried. The result obtained is a film having a porous surface and an area-specific total pore volume of 0.025 dm$^3$/m$^2$ and an average pore diameter of 2.0 μm and an average pore depth of 2.5 μm. This film is subsequently activated for 5 minutes in a solution consisting of 0.5 g of n-3-hepten-2-onepalladium chloride and 1,000 ml of 1,1,1-trichloroethane, dried and then sensitized in a solution consisting of 750 ml of distilled H$_2$O, 7.5 g of dimethylaminoborane and 1.75 g of (solid) NaOH, coppered in a commercially customary coppering bath, washed with water and heat-treated in a drying cabinet at 170° C. for one hour. The sample thus provided with a firmly adhering electroconductive metal layer is coated with a polybutadiene-based lacquer by means of screen printing, leaving blank free grid-like paths of about 200 μm, and the free metal surface is then electroplated with copper to a thickness of about 35 μm. The film is then freed from the mask in methyl ethyl ketone, and the chemically deposited copper layer underneath is etched off in H$_2$O$_2$-containing sulphuric acid solution. The result obtained is an electric circuit having about 200 μm wide and about 32 μm thick conducting paths. The metal layer adheres very firmly to the substrate surface and can be soldered by conventional methods.

EXAMPLE 2

1 l of solution of 5 ml of 37% strength HCl and 2.5 g of SnCl$_2$ in distilled water is added at 46° C. to 15 g of methanolic K$_2$PtCl$_6$ solution (Pt content about 1.75% by weight). This is followed by 45 minutes of stirring to give a darkly coloured homogeneous activating solution. This solution is used to treat polyimide films having been provided with pores according to Example 1 for 5 minutes. A film thus activated is sensitized in a sensitizing bath which contains per liter 20 ml of NH$_2$-NH$_2$, and 12 ml of 25% strength NH$_3$, for 7.5 minutes, then metallized in a commercially customary coppering bath at 80° C. for 45 minutes and is then heat-treated at 150° C. for 90 minutes. The result obtained is a film provided with a firmly adhering, ~3 μm thick Cu layer, which after a partial masking with a commercially available photoresist, after electroplating of the free paths and subsequent freeing of the film surface from photoresist and finally by etching off of the Cu layer underneath in a differential etching process is processable to give a solderable, flexible circuit.

The flexible circuits thus prepared are easily solderable with conventional soldering systems and survive the temperature cycling test customary in the industry.

EXAMPLE 3

A copper-laminated polyester film commercially available, for example from the firm of Krempel (West Germany), is freed of the Cu layer in a redox solution consisting of 50 ml of 37% strength HCl, 60 ml of H$_2$O$_2$ and 500 ml of H$_2$O. The result obtained is a film having a porous surface, an area-specific total pore volume of 0.024 dm$^3$/m$^2$ and an average pore diameter of 2.5 μm or a maximum pore depth of 3.0 μm. This film is activated in a solution consisting of 200 ml of acetone, 800 ml of distilled H$_2$O and 0.8 g of (mesityl oxide)palladium chloride in the course of 3 minutes. Thereafter the board is treated for 5 minutes in a solution of 5 g of dimethylaminoborane in 1 l of an H$^2$O/methanol mixture (50:50 % by volume). After a brief rinse, an approximately 0.2 μm thick Cu layer is applied in a chemical Cu bath. The chemically copperplated film is further processed as indicated in Example 4. The result obtained is a flexible circuit having a very firm metal adhesion.

EXAMPLE 4

Example 3 is repeated to produce in a conventional manner a Cu layer slightly thickened by electroplating (for example to within a range between 0.5 and 5 μm). The result obtained is a semifinished product which is usable in various ways for sensor engineering.

We claim:

1. A flexible electrical printed circuit consisting essentially of a flexible base material and a metallic conductor pattern thereon, the circuit being produced by base materials with an electrolytically produced metal foil, the cladding being removed, the base material being activated with a compound of a noble metal, metallic conductor patterns being applied to the semifinished products so obtained by using a semi or fully additive technique and annealing at a temperature of 50° C. or 180° C., wherein the activator is an organic compound of a noble metal of the 1st or 8th sub-group of the periodic system of elements and wherein the surface of the base material is characterized by
   (a) a specific total pore volume per unit area of 0.015–0.045 dm$^3$/m$^2$,
   (b) a means pore diameter of 0.05–12.0 μm and
   (c) a mean pore depth of 0.05–12.0 μm.

2. A flexible electrical printed circuit according to claim 1, wherein the noble metal compounds are selected from the group consisting of Pt, Pd, Au, Ag, Rh and mixtures thereof.

3. A flexible electrical printed circuit according to claim 1, wherein
   (a) the pore volume is 0.020–0.040 dm$^3$/m$^2$,
   (b) the pore diameter is 1–2 μm and
   (c) the pore depth is 0.5–2.5 μm.

4. A flexible electrical printed circuit according to claim 1, wherein the metal cladding is a copper or aluminum foil prepared by electrodeposition.

5. A flexible electrical printed circuit according to claim 1, wherein the annealing is conducted for a time of 5 to 60 minutes.

6. A flexible electrical printed circuit according to claim 1, wherein the pore volume is 0.023–0.038 dm$^3$/m$^2$.

7. A flexible electrical printed circuit according to claim 1, wherein the base material is a polymer selected from the group consisting of polytetrafluoroethylene, polyvinylidene fluoride, polyvinyl fluoride, aromatic polyesters, aliphatic polyesters, polyimides, polyamide imides, polycarbonates, polyamides, polysulphonates, a polycondensate based on bisphenol A and 4,4,'-dichlorodiphenyl sulphone, polyether sulphones, polyhydantoins, polybenzoxazinediones, polyphenylene sulphide and polyphenylene oxides.

8. A flexible electrical printed circuit according to claim 1, wherein the base material has a thickness of 20 μm to 250 μm.

9. A flexible electrical printed circuit according to claim 1, which further comprises said activation being carried out with a moiety for improving adhesion, said moiety having a functional group selected from the group consisting of carboxylic acid groups, carbonyl halide groups, carboxylic anhydride groups, carboxylic ester groups, carboxamide groups, carboximide groups, aldehyde groups, ketone groups, ether groups, sulphonamide groups, sulphonic acid groups, sulphonate groups, sulphonyl halide groups, sulphonic acid ester groups, halogen-containing heterocyclic radicals, activated double bonds-containing groups, amino groups, hydroxyl groups, isocyanate groups, olefin groups, acetylene groups, and mercapto groups.

10. A flexible electrical printed circuit according to claim 9, wherein said halogen-containing heterocyclic radicals are selected form the group consisting of chlorothiazinyl, chloropyrazinyl, chloropyrimidinyl and chloroquinoxalinyl, and wherein the activated double-bond containing groups are selected from the group consisting of vinylsulphonic acid and acrylic acid derivatives.

11. A flexible electrical printed circuit according to claim 1, wherein the noble metal is in the form of a guest/host complex.

12. A process for producing a flexible electrical printed circuit comprising
(i) treating with an organometallic activator system a flexible base material characterized by
(a) a specific total pore volume per unit area of 0.015–0.045 dm$^3$/m$^2$,
(b) a mean pore diameter of 0.05–12.0 μm and
(c) a mean pore depth of 0.05–12.0 μm, and
(ii) currentlessly metallizing the semifinished resultant product of step (i).

13. A process according to claim 12, further comprising laminating the base material on both sides thereof with a metal foil and chemically detaching the lamination in a redox bath of electrogalvanically.

14. A process according to claim 13, wherein the metal foil is selected from the group consisting of copper and aluminum.

15. A process according to claim 12, further comprising conducting heat treating to improve the adhesion of the metal or the base material, said heat treating conducted at a temperature from 50° C. to 250° C. for 5 minutes to 10 hours.

16. A flexible electrical printed circuit according to claim 1, wherein the cladding is removed chemically in a redox bath.

17. A flexible electrical printed circuit according to claim 1, wherein the cladding is removed electrolytically.

18. A flexible electrical printed circuit according to claim 1, wherein the activation is conducted with sensitization.

19. A process according to claim 12, wherein said treating further comprises sensitization.

* * * * *